(12) United States Patent
Murphy

(10) Patent No.: US 7,421,670 B2
(45) Date of Patent: Sep. 2, 2008

(54) CHIP DEVELOPMENT SYSTEM ENABLED FOR THE HANDLING OF MULTI-LEVEL CIRCUIT DESIGN DATA

(75) Inventor: Bernard Murphy, San Jose, CA (US)

(73) Assignee: Hercules Technology Growth Capital, Inc., Palo Alto, CA (US)

( * ) Notice: Subject to any disclaimer, the term of this patent is extended or adjusted under 35 U.S.C. 154(b) by 340 days.

(21) Appl. No.: 11/260,225

(22) Filed: Oct. 28, 2005

(65) Prior Publication Data

US 2006/0048083 A1 Mar. 2, 2006

Related U.S. Application Data

(62) Division of application No. 10/118,242, filed on Apr. 9, 2002, now Pat. No. 6,993,733.

(51) Int. Cl.
*G06F 17/50* (2006.01)

(52) U.S. Cl. .............................. 716/5; 716/4

(58) Field of Classification Search ................ 716/4–5
See application file for complete search history.

(56) References Cited

U.S. PATENT DOCUMENTS

| | | | |
|---|---|---|---|
| 4,937,755 A | 6/1990 | Yokata et al. |
| 5,050,091 A | 9/1991 | Rubin |
| 5,067,091 A | 11/1991 | Nakazawa |
| 5,197,016 A | 3/1993 | Sugimoto et al. |
| 5,222,030 A | 6/1993 | Dangelo et al. |
| 5,487,018 A | 1/1996 | Loos et al. |
| 5,537,329 A | 7/1996 | Feldmann et al. |
| 5,541,849 A | 7/1996 | Rostoker et al. |
| 5,555,201 A | 9/1996 | Dangelo et al. |
| 5,757,653 A | 5/1998 | Christian et al. |
| 5,781,446 A | 7/1998 | Wu |
| 5,812,775 A | 9/1998 | Van Seters et al. |
| 5,848,059 A | 12/1998 | Yamamoto |
| 5,930,830 A | 7/1999 | Mendelson et al. |
| 5,931,918 A | 8/1999 | Row et al. |
| 5,943,481 A | 8/1999 | Wakeland |
| 5,987,240 A | 11/1999 | Kay |
| 5,991,299 A | 11/1999 | Radogna et al. |
| 6,009,251 A | 12/1999 | Ho et al. |
| 6,011,911 A | 1/2000 | Ho et al. |
| 6,081,883 A | 6/2000 | Pepelka et al. |
| 6,157,901 A | 12/2000 | Howe |
| 6,167,480 A | 12/2000 | Williams et al. |
| 6,185,607 B1 | 2/2001 | Lo et al. |
| 6,226,680 B1 | 5/2001 | Boucher et al. |
| 6,243,359 B1 | 6/2001 | Roy et al. |
| 6,425,113 B1 | 7/2002 | Anderson et al. |
| 6,581,191 B1 | 6/2003 | Schubert et al. |
| 6,591,402 B1 | 7/2003 | Chandra et al. |
| 6,601,221 B1 | 7/2003 | Fairbanks |
| 6,618,839 B1 | 9/2003 | Beardslee et al. |
| 6,708,323 B2 | 3/2004 | Ohta et al. |
| 2003/0115562 A1 | 6/2003 | Martin et al. |

*Primary Examiner*—Stacy A Whitmore
(74) *Attorney, Agent, or Firm*—Sughrue Mion, PLLC

(57) ABSTRACT

A system and method for implementation of look-ahead design methodology. Efficient debugging of a design is accomplished by evaluating the high level register transfer level (RTL) representation of a device being designed by quickly simulating the downstream implementation of that device to expose potential implementation problems that would otherwise be found much later in the design or manufacturing cycle.

35 Claims, 9 Drawing Sheets

```
0605   module top(clk,reset,out);
0610   input clk, reset;
0615   output out;
0620   wire [1:0] cnt;
       // next line exhibits a feedback loop from cin input,
       // through counter, to cout output
0625   counter counter(3,clk,reset,c|reset,cnt,out,c);
0630   endmodule 0635   module counter(limit,clk,reset,cin,cnt,pulse,cout);
0640   input clk,reset, cin;
0645   input [1:0] limit;
0650   output pulse, cout;
0655   reg pulse;
0660   output [1:0] cnt;
0665   reg [1:0] cnt;

0670   always @(posedge clk)
              if ( ~reset) cnt <= 0;
              else         cnt <= cnt + 1;

0675   always @(cnt)
       // This line exhibits an inferred latch
       // The latch also can only switch to 1 output (never 0)
              if ( cnt == limit ) pulse = 1;

0680   assign cout = pulse & cin;

0685   endmodule
```

*FIG. 6*

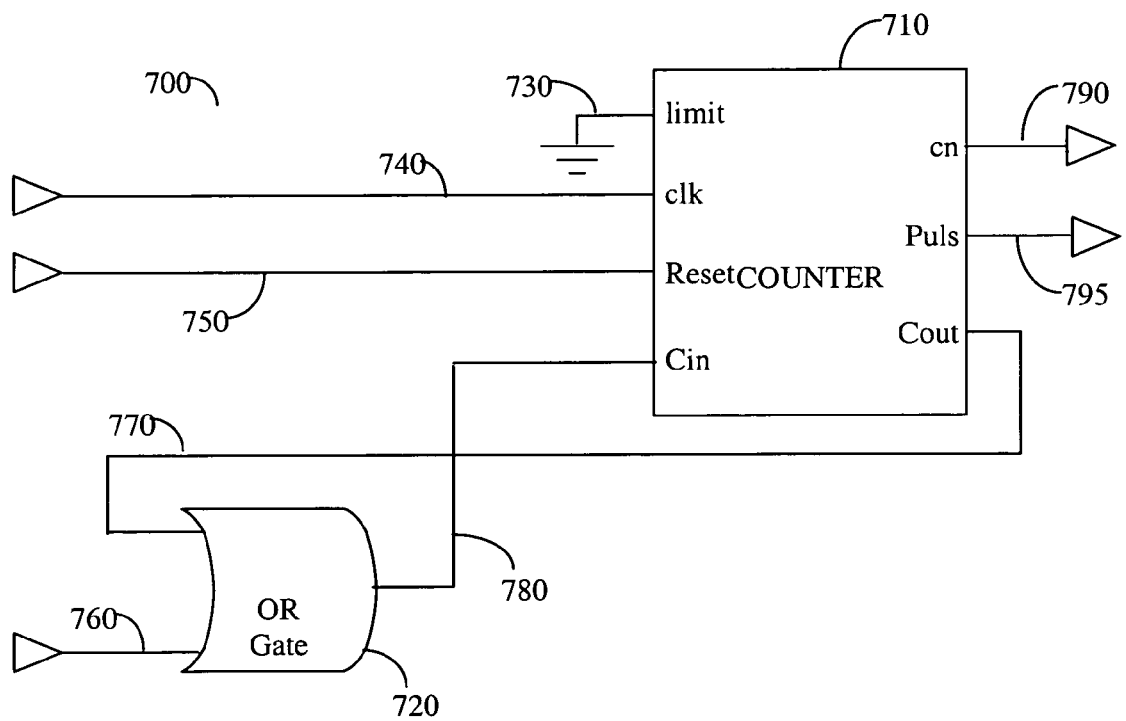

*FIG. 7*

```
0802    module counter (limit, clk, reset, cin, cnt, pulse, cout);
0804    input [1:0] limit;
0806    input clk;
0808    input reset;
0810    input cin;
0812    output      [1:0] cnt;
0814    output      pulse;
0816    output      cout;
0818    supply0     VSS;
0820    supply1     VCC;
0822    wire  [2:0] rtlc_N1;
0824    wire  rtlc_cnt_0_G3_SS_1;
0826    wire  rtlc_cnt_1_G4_SS_1;
0828    wire  rtlc_N6;

0830          RTL_AND    rtlc_I2 (.Z(cout), .in1(pulse), .in2(cin));
0832          M_RTL_INCR #(3)   rtlc_I12 (.out1(rtlc_N1), .in1({VSS, cnt}),
                 .cin(VCC));
0834          RTL_FD     rtlc_I20 (.Q(cnt[0]), .D(rtlc_cnt_0_G3_SS_1),
                 .CP(clk));
0836          RTL_FD     rtlc_I23 (.Q(cnt[1]), .D(rtlc_cnt_1_G4_SS_1),
                 .CP(clk));
0838          RTL_AND    rtlc_I26 (.Z(rtlc_cnt_0_G3_SS_1), .in1(reset),
                 .in2(rtlc_N1[0]));
0840          RTL_AND    rtlc_I29 (.Z(rtlc_cnt_1_G4_SS_1), .in1(reset),
                 .in2(rtlc_N1[1]));
0842          M_RTL_EQ #(2)    rtlc_I5 (.Z(rtlc_N6), .in1(cnt),
                 .in2(limit));
        // The latch device is inferred and therefore detected here
0844          RTL_LD     rtlc_I10 (.Q(pulse), .D(VCC), .E(rtlc_N6));
0846    endmodule 0848    module top (clk, reset, out);
0850    input clk;
0852    input reset;
0853    output      out;
0854    wire  [1:0] cnt;
0856    wire  c;
0858    supply1     VCC;
0860    wire  rtlc_N2;

0862          counter    counter ({VCC, VCC}, clk, reset, rtlc_N2, cnt, out,
                 c);
0864          RTL_OR     rtlc_I3 (.Z(rtlc_N2), .in1(c), .in2(reset));

0866    endmodule
```

*FIG. 8*

```
// The combinational loop becomes apparent by tracing paths from all
// nets through combinational elements and looking for paths that loop
// back on themselves. This loop is detected even though it crosses
// hierarchy boundaries
0905   module top (out, reset, clk)
0910   .counter.rtlc_I2 RTL_AND (
           .in1(.out)
           .in2(.rtlc_N2)
           .Z(.c)
       )
0915   .counter.rtlc_I12 M_RTL_INCR_3 (
           .in1[0](.cnt[0])
           .in1[1](.cnt[1])
           .in1[2](.counter.VSS)
           .cin(.counter.VCC)
           .out1[0](.counter.rtlc_N1[0])
           .out1[1](.counter.rtlc_N1[1])
           .out1[2](.counter.rtlc_N1[2])
       )
0920   .counter.rtlc_I20 RTL_FD (
           .D(.counter.rtlc_cnt_0_G3_SS_1)
           .CP(.clk)
           .Q(.cnt[0])
       )
0925   .counter.rtlc_I23 RTL_FD (
           .D(.counter.rtlc_cnt_1_G4_SS_1)
           .CP(.clk)
           .Q(.cnt[1])
       )
0930   .counter.rtlc_I26 RTL_AND (
           .in1(.reset)
           .in2(.counter.rtlc_N1[0])
           .Z(.counter.rtlc_cnt_0_G3_SS_1)
       )
0935   .counter.rtlc_I29 RTL_AND (
           .in1(.reset)
           .in2(.counter.rtlc_N1[1])
           .Z(.counter.rtlc_cnt_1_G4_SS_1)
       )
0940   .counter.rtlc_I5 M_RTL_EQ_2 (
           .in1[0](.cnt[0])
           .in1[1](.cnt[1])
           .in2[0](.VCC)
           .in2[1](.VCC)
           .Z(.counter.rtlc_N6)
       )
0945   .counter.rtlc_I10 RTL_LD (
           .D(.counter.VCC)
           .E(.counter.rtlc_N6)
           .Q(.out)
       )
0950   .rtlc_I3 RTL_OR (
           .in1(.c)
           .in2(.reset)
           .Z(.rtlc_N2)

```
1100  ##spyglass_version: 2.8.2
1110  ##cwd: /u/bmurphy
1120  ##lang: verilog
1130  ##args: -mSpyGlass::Compatibility::v2_7_3 -showsynth -showflat -
      verilog test.v -policies=_browse,area-beta,miscellaneous-beta,timing-
      beta -size_Xnor=($size-1)*6 -size_Not_equal=$size*7+2 -
      size_GE_unsigned=$size*10 -size_FlopPCE=24 -size_LogN_mux=$size*4+4 -
      size_Subtract_binary=$size*14 -size_Latch=8 -size_Tribuf=4 -
      size_Inv=2 -size_Nor=$size*2 -size_Flop=16 -size_And=$size*2+2 -
      size_GT_signed=$size*16 -size_Subtract_unary=$size*10 -
      size_Decoder=$size*8 -size_GT_unsigned=$size*10 -
      size_Decrement=$size*10 -size_Equal=$size*7 -size_Xor=($size-1)*6 -
      size_Mux=$size*4+4 -size_Multiply_unsigned=$size*20 -size_Buf=4 -
      size_Shift=$size*4 -size_Or=$size*2+2 -size_Nand=$size*2 -
      size_FlopPC=20 -size_GE_signed=$size*16 -size_Increment=$size*10 -
      size_Add_unsigned=$size*12 -long_name_max=80 -logmux_max=3 -
      delay_Subtract_unary=$size*2 -delay_Equal=$size*2 -delay_Buf=1 -
      delay_Shift=$size*2 -delay_Nand=($size/4)+1 -delay_Increment=$size*2
      -delaymax=10 -delay_Xnor=($size/4)+1 -delay_LogN_mux=$size/4+1 -
      delay_Nor=($size/4)+1 -delay_And=($size/4)+1 -delay_GT_signed=$size*2
      -delay_Decoder=log2($size)+1 -delay_Decrement=$size*2 -
      delay_GT_unsigned=$size*2 -delay_Xor=($size/4)+1 -delay_Mux=2 -
      sr_max=20 -delay_Multiply_unsigned=$size*4 -delay_Or=($size/4)+1 -
      bigmux_max=4 -fanoutmax=20 -delay_Add_unsigned=$size*2 -
      delay_GE_signed=$size*2 -delay_GE_unsigned=$size*2 -
      delay_Not_equal=$size*2 -delay_Tribuf=1 -delay_Latch=2 -
      delay_Subtract_binary=$size*2 -delay_Inv=1 -ignore_nets=clk -rules
      NLView -rules ChildSpan -rules ResourceShare -rules GateCount -rules
      LongName -rules _cp -rules ConstSig -rules UnconstrIn -rules
      UnconstrOut -rules UnconstrClock -rules DeepMux -rules LogNMux -rules
      InferLatch -rules UnregOut -rules MaxFanout -rules ShiftReg -rules
      CombLoop -rules LogicDepth -noreport -vdbfile spyglass.vdb
1140  ##files: test.v
1150  #child top counter counter
1160  #child counter
1170  #span top test.v 1 6
1180  #span counter test.v 8 25
1190  GateCount@@S13@@Info@@test.v@@8@@1@@10@@counter 102
1200  GateCount@@S13@@Info@@test.v@@1@@1@@10@@top 108
1210  InferLatch@@S.8@@Rule@@test.v@@21@@1@@10@@Latch inferred for signal
      'pulse'
1220  CombLoop@@@@Error@@test.v@@1@@1@@2@@Detected combinational loop at
      top.rtlc_N2-top.c
1230  #xpath@@mod top@@c t rtlc_I3 in1 t counter cout @@rtlc_N2 t counter cin t
      rtlc_I3 Z @@endmod@@end
```

*FIG. 10*

CHIP DEVELOPMENT SYSTEM ENABLED FOR THE HANDLING OF MULTI-LEVEL CIRCUIT DESIGN DATA

This is a divisional of U.S. application Ser. No. 10/118,242 filed Apr. 9, 2002 now U.S. Pat. No. 6,933,733. The entire disclosure of the prior application, U.S. application Ser. No. 10/118,242 is hereby incorporated by reference.

BACKGROUND OF THE PRESENT INVENTION

1. Technical Field of the Present Invention

The present invention generally relates to the design automation of complex circuits to be integrated on a single semiconductor device. More specifically, the invention relates to the specific stages of semiconductor chip design tools and methodologies.

2. Description of the Related Art

There will now be provided a discussion of various topics to provide a proper foundation for understanding the present invention.

In recent years, the ability to design complex semiconductor devices has increased and it is quite common to observe designs with millions of gates all reduced to a single integrated circuit. Today's complex designs are combinations of acquired intellectual property (IP) in the form of logic design libraries such as logic gates, flip-flops, memories, etc., as well as more complex building blocks such as micro-controllers, digital signal processors (DSP), phase-locked loops and many others. Designers combine these design libraries with their self-conceived innovations and ideas, as well as with portions of designs that may have been previously used, to form new and more sophisticated solutions.

Referring to FIG. 1, the process of the design of a semiconductor device is illustrated, where the various stages of a design are shown. Commonly, a design is described in a hardware definition language (HDL), such as register transfer level (RTL). This enables the capturing of the design concepts in a manner that allows certain automated tools to handle the process of turning the design concepts into a transistor level solution required for the actual manufacturing of a semiconductor device.

An HDL representation 110 of a chip is prepared, at least partially based on the design representation 120 supplied for the purpose of designing the chip. It should be noted that the design representation 120 has certain constraints 170A. Constraints 170A define the ways that the design representation 120 may be used and such constraints ought to be at least partially taken into consideration as early as the HDL 110 stage of the design. Upon completion, or at least partial completion of the design, the verification stage 130 may begin. However, such verification must take into consideration various constrains 170B, which may be constraints imposed by the designer, the combinational use of the design representation 120 with the newly added designs, and other factors. If errors are detected, the HDL 110 must be corrected based on the errors found in this stage. Next, the synthesis stage 140 takes place, where the general logic design is further detailed in the transistor level. Additional constraints 170C are added at this stage, and may be constraints relative to the drive capability of transistors, speed requirements and similar parameters. If errors are detected, the HDL 110 must be corrected based on the errors found at this stage. These steps are similarly repeated at test stage 150 and the manufacture stage 160, adding constraints 170D and 170E that must be taken into consideration to ensure a successful and operative chip. At each such stage, upon detection of an error, the HDL 110 must be corrected and the process repeated. The compliance with the process is important as is the manufacturing costs of sophisticated devices which, when using deep sub-micron design rules, is extremely high. Moreover, additional design and manufacturing cycles are not only expensive but contribute to delays in introduction of products into the marketplace. It should be further noted that such complex devices are customarily designed by large groups of engineers of different backgrounds and geographical locations, further enhancing the design's vulnerability to errors.

It would be therefore advantageous to develop a system and a method that allows for easy collaboration between large groups of designers using multiple sources of design representation and design types. It would be further advantageous if there would be easy referencing between each stage of the design for quick identification and corrections of design errors.

SUMMARY OF THE PRESENT INVENTION

The present invention has been made in view of the above circumstances and to overcome the above problems and limitations of the prior art.

A system, method and programmed product is provided for the purpose of a look-ahead design methodology. The system includes a constraint database, a means for design analysis and a means for detecting design violations based on information from the constraint database and results of the design analysis. Specifically, the design analysis includes means for hierarchical design analysis, structural design analysis and flat gate netlist analysis.

A chip development system is also provided wherein a sub-system is capable of look-ahead design analysis, the sub-system having an design constraint input means, a design high-level definition input means and a means for providing feedback of design violations.

Additional aspects and advantages of the present invention will be set forth in part in the description that follows and in part will be obvious from the description, or may be learned by practice of the present invention. The aspects and advantages of the present invention may be realized and attained by means of the instrumentalities and combinations particularly pointed out in the appended claims.

A first aspect of the present invention provides a system for look-ahead design analysis. The system for look-ahead design analysis comprises a constraint database. The system further comprises means for design analysis comprising hierarchical design analysis means, structural design analysis means and flat gate netlist design analysis means. The system for look-ahead analysis further comprises means for detecting hierarchical design violations based on information from the constraint database. The means for detecting hierarchical design violations also uses results from the hierarchical design analysis means, structural design analysis means and flat gate netlist design analysis means.

A second aspect of the invention provides a method for look-ahead design analysis. The method for look-ahead design analysis comprises first collecting constraint data in a constraint database. Next, the method performs at least a hierarchical design analysis and a structural design analysis. Following the design analyses, the method detects design violations based on information from the constraint database, as well as the results from the hierarchical design analysis and structural design analysis.

A third aspect of the invention provides a computer software product for the purpose of look-ahead design analysis. The computer program product comprises software instructions that enable the computer software product to perform predetermined operations for look-ahead design analysis, and a computer readable medium bearing the software instructions. The predetermined operations comprise first collecting constraint data in a constraint database. The predetermined operations further comprise performing a hierarchical design analysis and a structural design analysis. Following the design analyses, the predetermined operations next detect design violations based on information from the constraint database and based on the results from the hierarchical design analysis and the structural design analysis.

A fourth aspect of the present invention provides a chip development system that comprises a look-ahead design analysis sub-system. The chip development system further comprises means for inputting design constraints, and means for inputting a design high-level definition. In addition, the chip development system further comprises means for providing feedback of design violations.

A fifth aspect of the present invention provides a look-ahead design analysis mechanism that comprises a constraint database, and a design analysis mechanism operably configured to perform hierarchical design analysis, structural design analysis and flat gate netlist design analysis. The design analysis mechanism further provides a detection mechanism operably configured to detect design violations based on information from the constraint database and based on the results from the hierarchical design analysis, the structural design analysis and the flat gate netlist design analysis.

The above aspects and advantages of the present invention will become apparent from the following detailed description and with reference to the accompanying drawing figures.

BRIEF DESCRIPTION OF THE DRAWINGS

The accompanying drawings, which are incorporated in and constitute a part of this specification, illustrate the present invention and, together with the written description, serve to explain the aspects, advantages and principles of the present invention. In the drawings.

FIG. 6 is an example of an RTL input to an embodiment of the invention;

FIG. 7 is a block diagram of the example circuit described in FIG. 6;

FIG. 8 is an exemplary output report from the logic hierarchy analysis for the example circuit described in FIG. 6;

FIG. 9 is an exemplary output report from the flat gate netlist analysis for the example circuit described in FIG. 6; and FIG. 10 is an exemplary report generated as a result of an error detected in the example circuit described in FIG. 6.

DETAILED DESCRIPTION OF THE INVENTION

Prior to describing the aspects of the present invention, some details concerning the prior art will be provided to facilitate the reader's understanding of the present invention and to set forth the meaning of various terms.

As used herein, the term "computer system" encompasses the widest possible meaning and includes, but is not limited to, standalone processors, networked processors, mainframe processors, and processors in a client/server relationship. The term "computer system" is to be understood to include at least a memory and a processor. In general, the memory will store, at one time or another, at least portions of executable program code, and the processor will execute one or more of the instructions included in that executable program code.

As used herein, the terms "predetermined operations," the term "computer system software" and the term "executable code" mean substantially the same thing for the purposes of this description. It is not necessary to the practice of this invention that the memory and the processor be physically located in the same place. That is to say, it is foreseen that the processor and the memory might be in different physical pieces of equipment or even in geographically distinct locations.

As used herein, the terms "media," "medium" or "computer-readable media" include, but are not limited to, a diskette, a tape, a compact disc, an integrated circuit, a cartridge, a remote transmission via a communications circuit, or any other similar medium useable by computers. For example, to distribute computer system software, the supplier might provide a diskette or might transmit the instructions for performing predetermined operations in some form via satellite transmission, via a direct telephone link, or via the Internet.

Although computer system software might be "written on" a diskette, "stored in" an integrated circuit, or "carried over" a communications circuit, it will be appreciated that, for the purposes of this discussion, the computer usable medium will be referred to as "bearing" the instructions for performing predetermined operations. Thus, the term "bearing" is intended to encompass the above and all equivalent ways in which instructions for performing predetermined operations are associated with a computer usable medium.

Therefore, for the sake of simplicity, the term "program product" is hereafter used to refer to a computer-readable medium, as defined above, which bears instructions for performing predetermined operations in any form.

A detailed description of the aspects of the present invention will now be given referring to the accompanying drawings.

Figure 1:
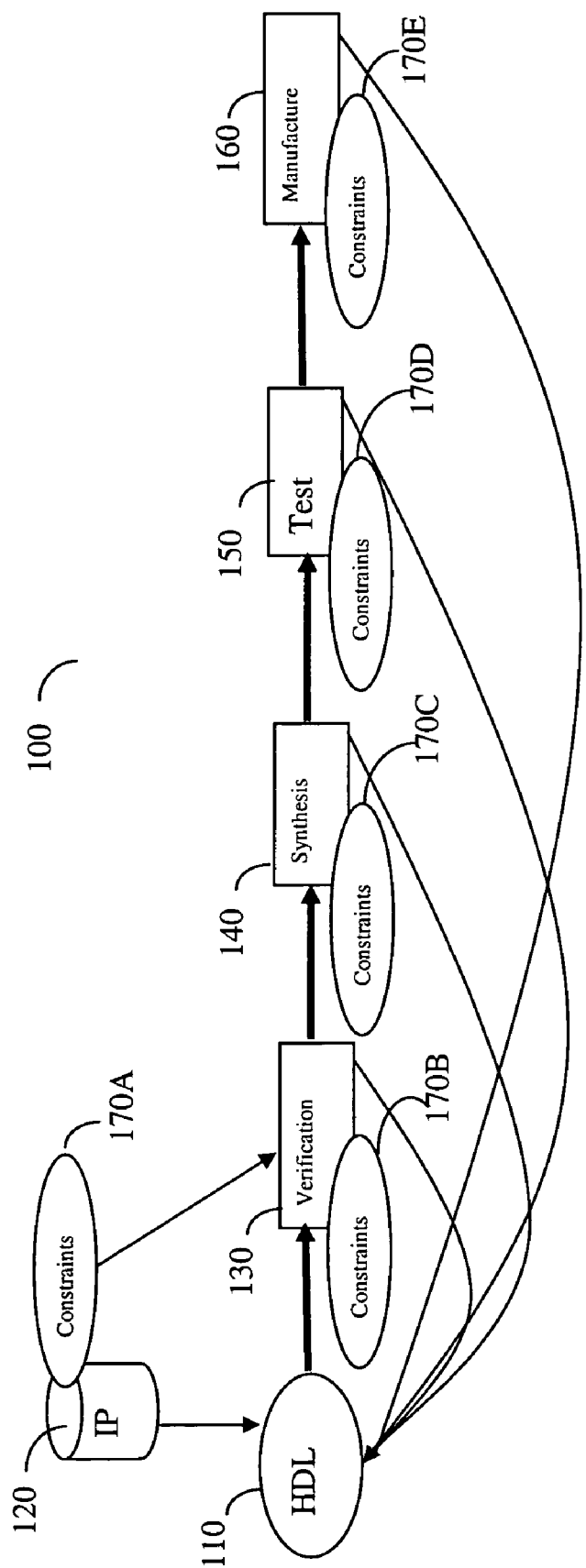
FIG. 1 is a diagram of a conventional design methodology flow.
Figure 2:
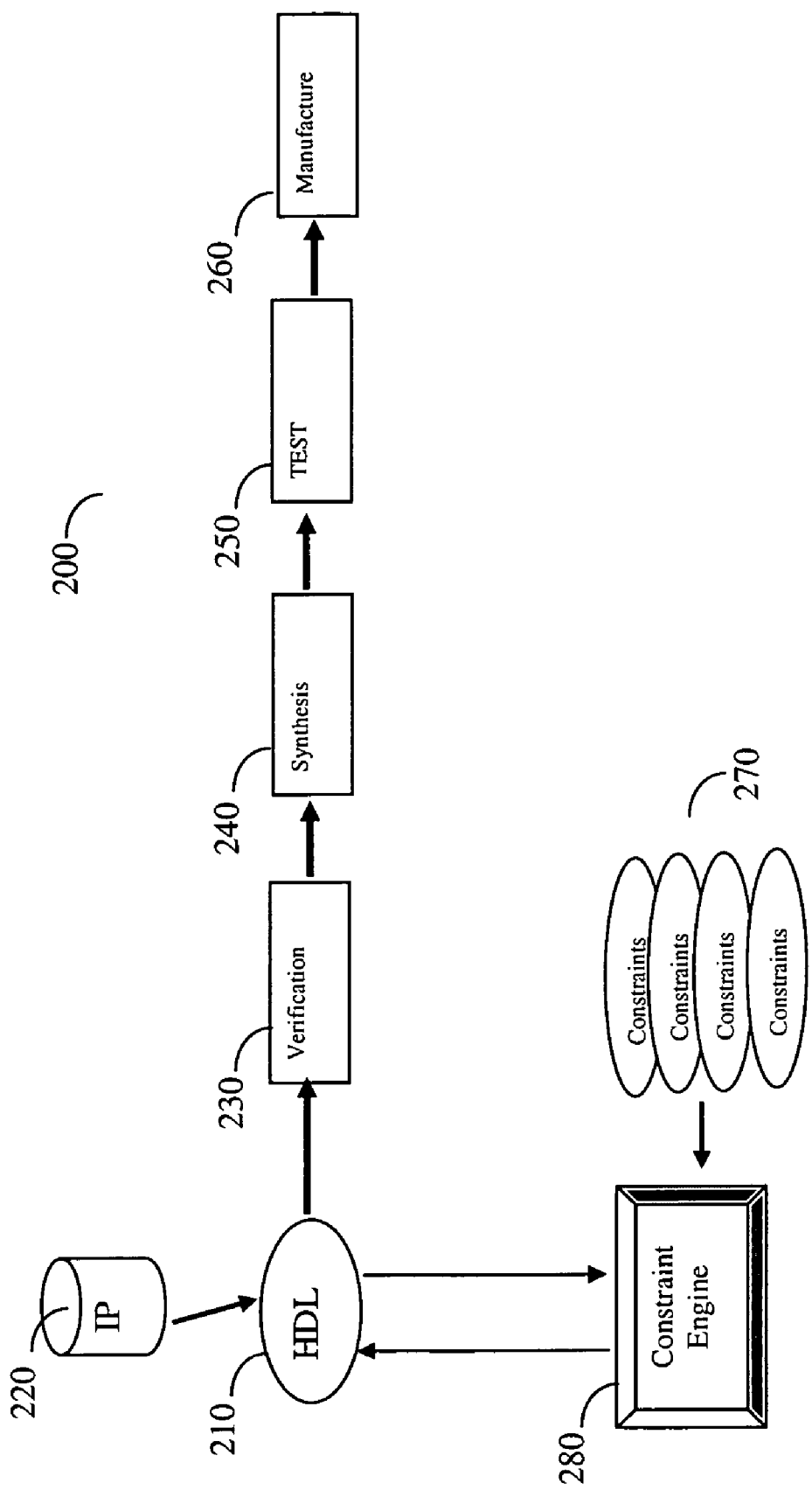
FIG. 2 is an exemplary schematic block diagram of an embodiment of the invention.

Referring to FIG. 2, an architecture 200 for design control capable of ensuring clean HDL designs is presented. The HDL 210 may be represented by register transfer level (RTL) in terms of VHSIC HDL (VHDL) or Verilog. The HDL 210 is connected to a constraint engine 280 that in turn receives multiple constraints applicable to the various stages of the design process. These may include, but are not limited to, constraints relative to the design representation 220, the verification stage 230, the synthesis stage 240, the test stage 250 and the manufacture stage 260. All of the constraints 270 are fed to the constraint engine, as well as the HDL 210, and the impact of the constraints is evaluated. Feedback on problems may be provided at each of the design levels, as well as feedback directed at the HDL 210 level. This significantly reduces the need to track low level errors at a late stage of the design and the way it relates to the HDL 210. It should be noted that the constraints may apply to all portions of the design, or only to certain portions thereof. For example, a purchased design representation 220 may have constraints that are valid only to such design representation 220 and not to any other component used in the stages of the design. For example, input/output (I/O) circuits usually have constraints that are significantly different from other constraints imposed on other portions of the design.

Figure 3:
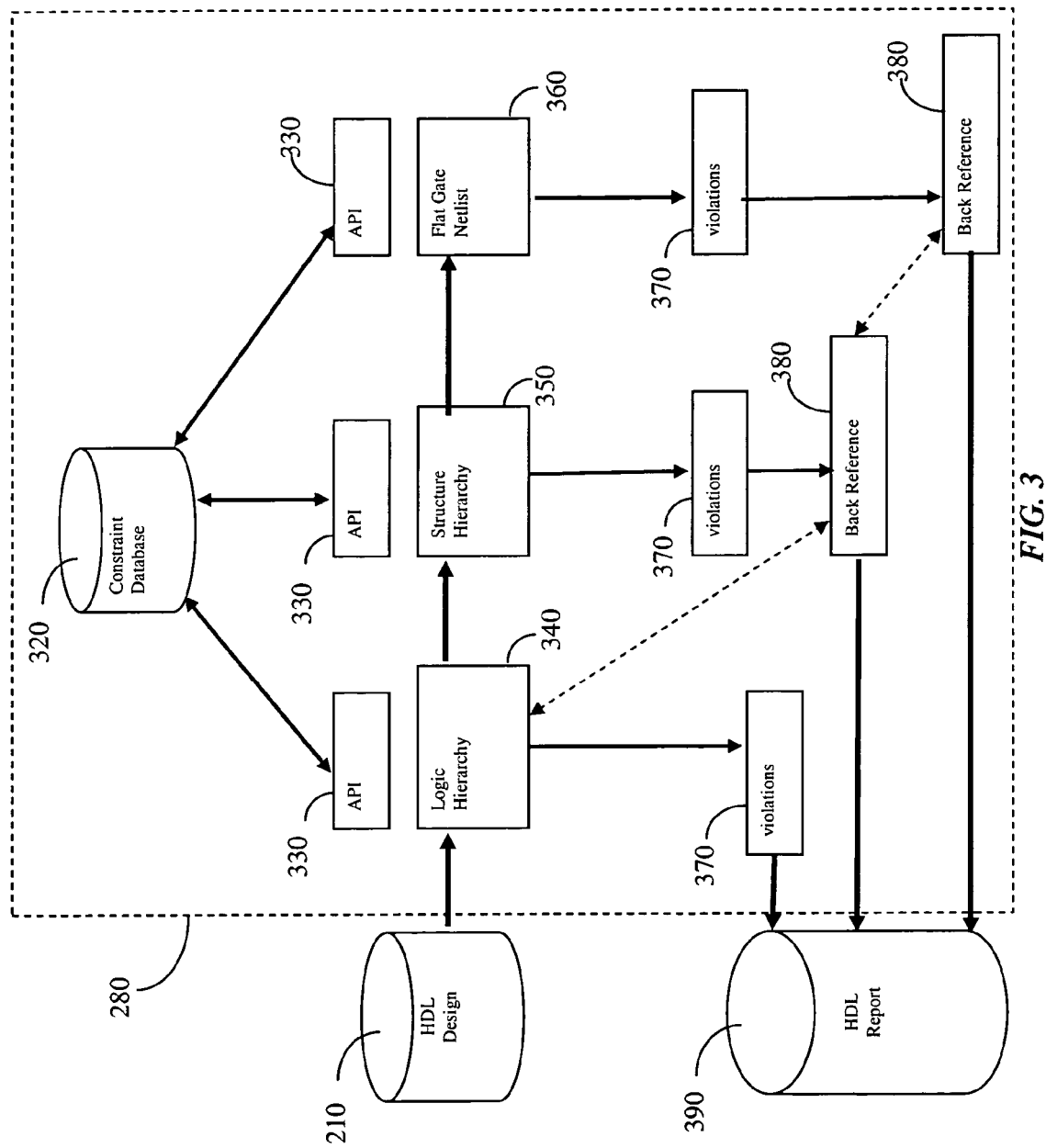
FIG. 3 is an exemplary schematic block diagram of a look-ahead architecture.

Referring to FIG. 3, a look-ahead architecture for an implementation of the constraint engine 280 is described in more detail. The look-ahead architecture described enables the low-level analysis to occur at an early stage providing immediate feedback from a lower-level stage of the design to a higher-level stage of the design. A constraint database 320 contains the various constraints relative to the specific design. It may contain rules relative to the use of the specific HDL used for the description, as well as other rules and constraints specific to the design, application and technology used. The logic hierarchy analyzer (LHA) 340 analyses such rules, referred to as style rules, and applies them to cases such as signals, sensitivities and comments. The structure hierarchy analyzer (SHA) 350 analyses such rules, referred to as inference rules, and applies it to cases such as inferred latches, flip-flops and counters. The flat gate netlist analyzer (FGNA) 360 analyses such rules, referred to as connectivity rules, and apples them to cases such as connectivity, cone analysis and design for testability (DFT). The constraint database 320 interfaces with the various analysis stages through specific application interfaces (API) 330, each customized to provide the necessary interface for the specific stage at hand.

The HDL 210 design is provided to LHA 340, where the analysis described above is performed. When violations are detected at LHA 340 level, the violations 370 are directly reported to HDL report database 390. The violations 370 detected at SHA 350 level are first back-referenced 380 to LHA 340 for the purpose of identification of the violation in the logical representation. The error is then reported to the HDL report database 390. The violations 370 detected at FGNA 360 are first back-referenced 380 to the back-reference stage of SHA 350, and then back-referenced to LHA 340 stage. This allows for the identification of the error also in the higher levels, namely the structure and the logic levels, allowing for an easier correction of the error detected, directly at the HDL level. The error is then reported to HDL report database 390.

Figure 4:
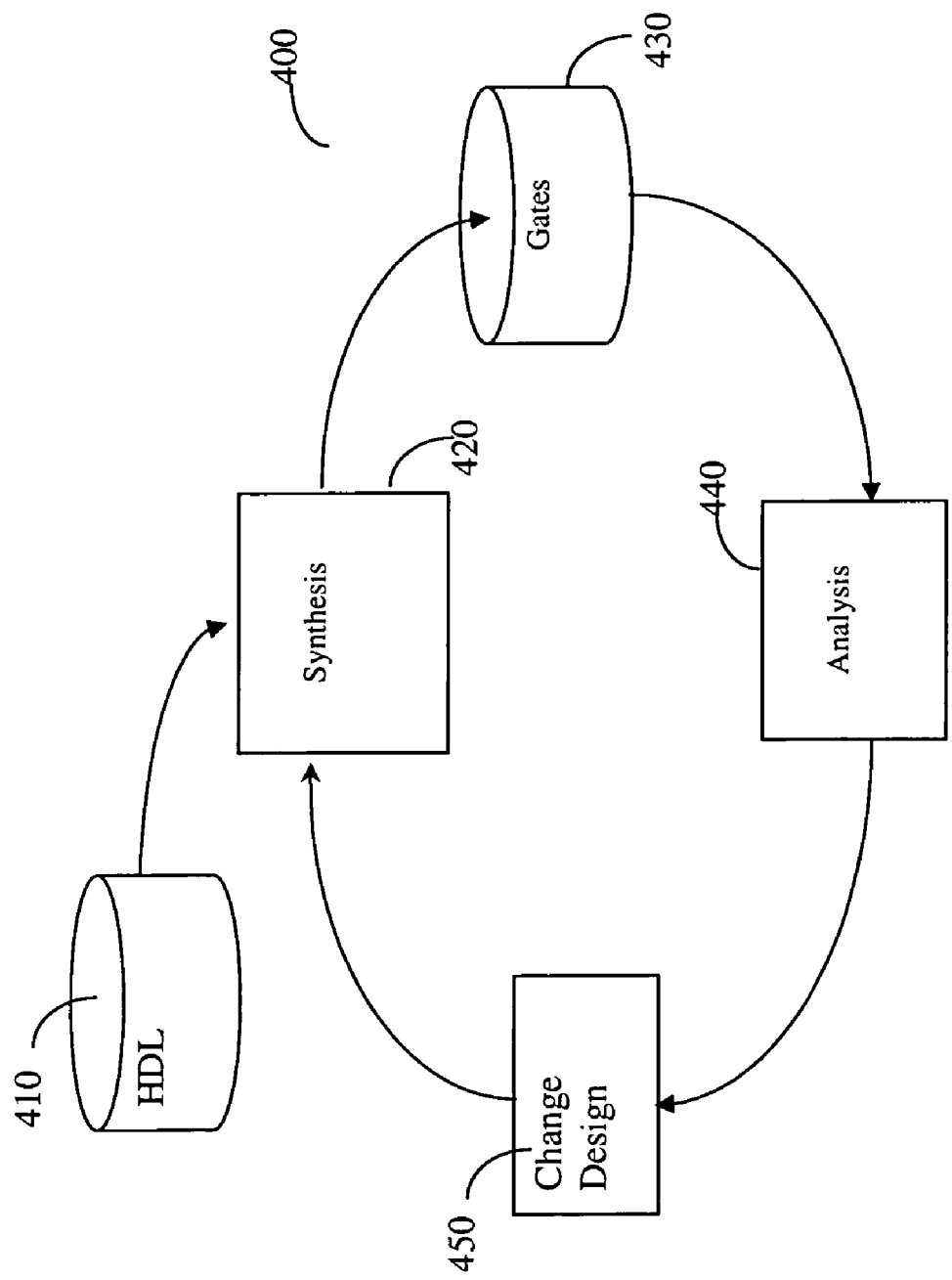
FIG. 4 is a schematic diagram of the design process used in an embodiment of the invention.

Referring to FIG. 4, the process is schematically described. The process begins with a HDL 410 that goes through a synthesis process 420. The result of the synthesis is a gate level design 430. The gate level design is then analyzed 440 and if errors are found, design changes take place 450. This process may be a repetitive process until such time where the design is error free. The advantage of the proposed system and method is in the fact that all the user intervention is done at the highest level possible for design fixing, thereby ensuring that the time and cost required to implement those fixes are minimized.

Figure 5:
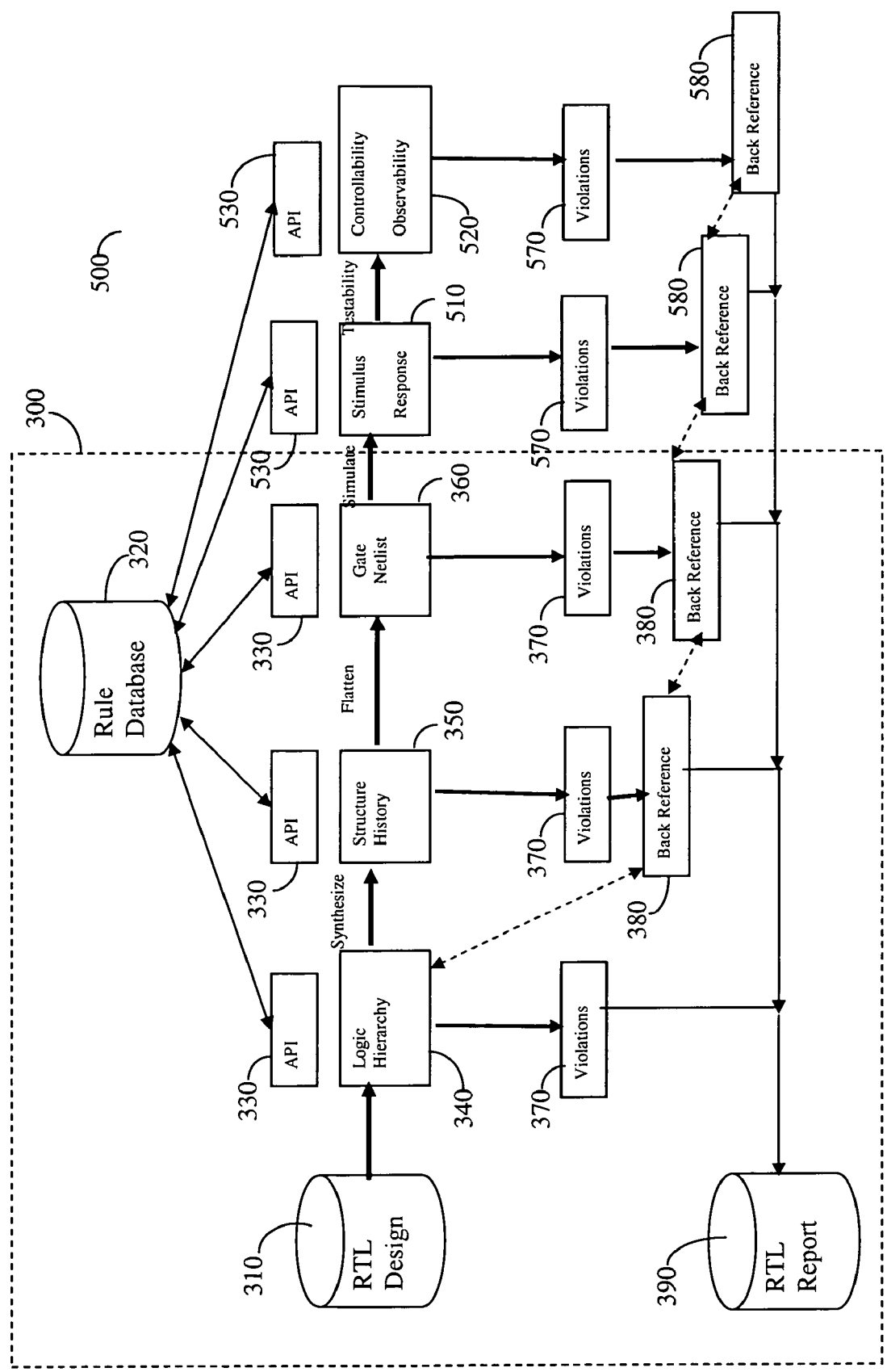
FIG. 5 is an exemplary schematic block diagram of an extended look-ahead architecture.

Referring to FIG. 5, an extension of architecture 300 is shown. Two additional stages are added to the system for the purpose of ensuring post manufacturing constraint compliance, otherwise known as design for testability (DFT). In these two stages, the capability of testing and scanning the chip are checked 510, as well as the ability to control, observe and initialize the chip 520. Violations 570 are reported through a back-reference mechanism 580 such that the error is represented at each stage of the design all the way back to the highest description level possible. This again allows for the correction of the problem at the highest design level possible.

The following description is an exemplary implementation and use of the disclosed invention. Referring to FIG. 6, exemplary code in RTL is provided. In line 0605, the top module description begins and its description ends at line 0630. The module has two inputs, "clk" and "reset", defined in line 0610, as well as an output "out" defined in line 0615. The "cnt" is a two-bit signal and therefore a two-wire bus is defined in line 0620. The connection of the counter is defined in line 0625. The counter definition is as follows: counter (3, clk, reset, c|reset, cnt, out, c)

Referring to FIG. 7, the resultant logic description of circuit 700 is shown. Specifically, the pins of counter 710 are as follows: limit, clk, Reset, Cin, cnt, Pulse, and Cout, corresponding to 3, clk, reset, c|reset, cnt, out, c respectively of "counter" above. The notation "3" is used to define a two-bit connection with each bit connected to "power". "clk" is used to denote a clock. "reset" is a signal used for the resetting of a device, specifically, setting its output to "0". In the case of this counter, the output "cnt" will have the value "0" after reset, i.e., both wires of "cnt" will have the logical value "0". The notation "c|reset" means that the input Cin of counter 710 will receive the value of reset logically "OR"ed with the value of "c". It can be easily seen that the value of "c" is provided from Cout of counter 710. This connection has created a feedback loop from Cout through OR gate 720 and back to counter 710. However, this feedback loop may not be easily observed at this level of description because a part of the connection can only be inferred in a lower level of the hierarchy. Lines 0635 through 0685 further describe the behavior of counter 710.

Referring to FIG. 8, the output from logic hierarchy 340 is shown. As a result of the feedback loop explained above, an inferred latch device is actually created as can be seen in line 0844. This latch is not one intended in the original design and is a result of a design error. Referring to FIG. 9, the result of flat gate netlist 360 is shown. The combinational loop becomes apparent by tracing paths from all nets through combinational elements and searching for paths that loop back on themselves. This allows for the detection of such feedback loops even though such loops may cross hierarchy boundaries. While hierarchy-based methods frequently report false feedback where no feedback exists, this test method is unambiguous, i.e., not subject to false reporting of errors.

Referring to FIG. 10, an output report is provided making notification of the error detected. The report is provided in HDL report 390. Specifically, line 1210 signals that there is a latch inferred for the signal "pulse". Next, in line 1220 the specific error is detected as a combinational loop and indicating the specific place, by source (input) file and line-number in that file where such error has occurred. By providing the high level pinpoint notification of the error, the designer is assured of early and easy detection of design failure which would have been otherwise detected at a much later stage of the design phase.

The foregoing description of the aspects of the present invention has been presented for purposes of illustration and description. It is not intended to be exhaustive or to limit the present invention to the precise form disclosed, and modifications and variations are possible in light of the above teachings or may be acquired from practice of the present invention. The principles of the present invention and its practical application were described in order to enable one skilled in the art to utilize the present invention in various embodiments and with various modifications as are suited to the particular use contemplated.

Thus, while only certain aspects of the present invention have been specifically described herein, it will be apparent that numerous modifications may be made thereto without departing from the spirit and scope of the present invention. Further, acronyms are used merely to enhance the readability of the specification and claims. It should be noted that these acronyms are not intended to lessen the generality of the terms used and they should not be construed to restrict the scope of the claims to the embodiments described therein.

What is claimed is:

1. A chip development system comprising:
   a look-ahead design analysis sub-system;
   means for inputting design constraints;
   means for inputting a design high-level definition; and
   means for providing feedback of design violations;
   wherein said look-ahead design analysis sub-system comprises:
   a constraints database;
   means for design analysis comprising hierarchical design analysis means, structural design analysis means and flat gate netlist design analysis means; and
   means for detecting design violations based on information from said constraints database and results from said hierarchical design analysis means, structural design analysis means and flat gate netlist design analysis means.

2. The development system as claimed in claim 1, wherein said means for design analysis interfaces with said constraint database through an application interface.

3. The development system as claimed in claim 1, wherein said application interface interfaces with means for hierarchical design analysis.

4. The development system as claimed in claim 2, wherein said application interface interfaces with means for structural design analysis.

5. The development system as claimed in claim 2, wherein said application interface interfaces with means for flat gate netlist design analysis.

6. The development system as claimed in claim 1, wherein said hierarchical design means detects hierarchical design violations that are stored in a violations database.

7. The development system as claimed in claim 1, wherein said structural design analysis means detects structural design violations are provided to said means for providing feedback of design violations.

8. The development system as claimed in claim 7, wherein said flat gate netlist design violation is reported to said means for providing feedback of design violations as a top-level design violation.

9. The development system as claimed in claim 8, wherein said post manufacturing compliance means are at least design testability means.

10. The development system as claimed in claim 9, wherein said design testability means comprise at least one of a testing means, a scanning means, a control means, an observation means, or an initialization means.

11. The development system as claimed in claim 10, wherein said design testability means is further capable of reporting design violation to said means for providing feedback of design violations.

12. The development system as claimed in claim 11, wherein said reporting is further provided to a previous stage analyzer.

13. The development system as claimed in claim 7, wherein said structural design violation is reported to said means for hierarchical design analysis.

14. The development system as claimed in claim 13, wherein said structural design violation is reported to said means for providing feedback of design violations as a top-level design violation.

15. The development system as claimed in claim 1, wherein said flat gate netlist design violations are provided to said means for providing feedback of design violations.

16. The development system as claimed in claim 15, wherein said flat gate netlist design violation is reported to said structural design analysis means.

17. The development system as claimed in claim 16, wherein said flat gate netlist design violation is reported to said means for providing feedback of design violations at the structural design level.

18. The development system as claimed in claim 16, wherein said flat gate netlist design violation is further reported to said hierarchical analysis means.

19. The development system as claimed in claim 1, wherein said look-ahead design analysis sub-system further comprises post manufacturing compliance means.

20. The development system as claimed in claim 1, wherein said design constraints are stored in a constraints database.

21. The development system as claimed in claim 20, wherein said constraint database comprises at least one constraint rule.

22. The development system as claimed in claim 21, wherein said at least one constraint rule is a style rule.

23. The development system as claimed in claim 22, wherein said style rule applies to at least one of a signal, a sensitivity, or a comment.

24. The development system as claimed in claim 21, wherein said at least one constraint rule is an inference rule.

25. The development system as claimed in claim 24, wherein said inference rule applies to at least one of a latch, a flip-flop, or a counter.

26. The development system as claimed in claim 21, wherein said at least one constraint rule is a connectivity rule.

27. The development system as claimed in claim 26, wherein said connectivity rule applies to at least one of a connection, a cone analysis, or a design testability.

28. The development system as claimed in claim 1, wherein said design violations are stored in a violations database.

29. A chip designed using the development system of claim 1.

30. A circuit designed using the development system of claim 1.

31. A violations report provided by the development system of claim 1.

32. The development system of claim 1, wherein said development system is enabled to detect an inferred latch device.

33. The development system of claim 32, wherein said inferred latch device is detected based on the detection of the existence of a combinational loop in a circuit.

34. The development system of claim 1, wherein said development system is enabled to accept a circuit description in at least one of plurality of hardware description languages.

35. A computer readable media embodying a plurality of instructions that, when executed on the development system of claim 1, detects hierarchical design violations based on information from said constraint database and results from said hierarchical design analysis means, structural design analysis means and flat gate netlist design analysis means.

* * * * *